(12) United States Patent
Gasparyan et al.

(10) Patent No.: US 7,973,637 B2
(45) Date of Patent: Jul. 5, 2011

(54) MEMS DEVICE WITH BI-DIRECTIONAL ELEMENT

(75) Inventors: Arman Gasparyan, Gillette, NJ (US); John VanAtta Gates, II, New Providence, NJ (US); Maria Elina Simon, New Providence, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 0 days.

(21) Appl. No.: 12/732,752

(22) Filed: Mar. 26, 2010

(65) Prior Publication Data

US 2010/0182120 A1   Jul. 22, 2010

(51) Int. Cl.
*H01H 61/01* (2006.01)

(52) U.S. Cl. ........ 337/123; 700/302; 337/132; 337/139; 382/233; 60/527

(58) Field of Classification Search ............ 700/302; 337/123, 132, 139; 382/233; 60/527
See application file for complete search history.

(56) References Cited

U.S. PATENT DOCUMENTS

| | | |
|---|---|---|
| 6,268,635 B1 | 7/2001 | Wood |
| 6,407,478 B1 | 6/2002 | Wood et al. |
| 6,608,714 B2 | 8/2003 | Hanson et al. |
| 6,624,730 B2 | 9/2003 | Johnson et al. |
| 6,679,055 B1 | 1/2004 | Ellis |
| 6,718,764 B1 * | 4/2004 | Sarkar et al. ............... 60/527 |
| 6,904,191 B2 | 6/2005 | Kubby |
| 7,036,312 B2 | 5/2006 | Menard et al. |
| 7,084,726 B2 | 8/2006 | Gupta et al. |
| 7,548,145 B2 | 6/2009 | Rubel |
| 2006/0238279 A1 | 10/2006 | Lu et al. |
| 2007/0096860 A1 | 5/2007 | Foster et al. |
| 2008/0087530 A1 | 4/2008 | Paranjpye et al. |

OTHER PUBLICATIONS

Larsen, et al. "MEMS device for bending test: measurements of fatigue and creep of electroplated nickel"; Sensors and Actuators; A 103; 2003; pp. 156-164.
Modlinski, et al. "Creep as a reliability problem in MEMS;" Microelectronics Reliability, vol. 44; Sep. 2004; pp. 1733-1738.
Vickers-Kirby, et al. "Anelastic Creep Phenomena in Thin Metal Plated Cantilevers for MEMS;" Material Research Society Symposium Proceedings; vol. 657; Nov. 2001; pp. EE2.5.1-EE2.5.6.
Modlinski, et al. "Creep-resistant aluminum alloys for use in MEMS;" Journal of Micromechanics and Microengineering; vol. 15; Jul. 2005; pp. S165-S170.
Agrawal, "A Latching MEMS Relay for DC and RF Applications", IEEE, 8.2, pp. 222-225.
Rebeiz, et al., "RF MEMS Switches and Switch Circuits", IEEE Microwave Magazine, Dec. 2001, pp. 59-71.

\* cited by examiner

*Primary Examiner* — Albert Decady
*Assistant Examiner* — Tejal J Gami
(74) *Attorney, Agent, or Firm* — Hitt Gaines, P.C.

(57) ABSTRACT

The present invention provides a bi-directional microelectromechanical element, a microelectromechanical switch including the bi-directional element, and a method to reduce mechanical creep in the bi-directional element. In one embodiment, the bi-directional microelectromechanical element includes a cold beam having a free end and a first end connected to a cold beam anchor. The cold beam anchor is attached to a substrate. A first beam pair is coupled to the cold beam by a free end tether and is configured to elongate when heated thereby to a greater temperature than a temperature of the cold beam. A second beam pair is located on an opposing side of the cold beam from the first beam pair and is coupled to the first beam pair and the cold beam by the free end tether. The second beam pair is configured to elongate when heated thereby to the greater temperature.

6 Claims, 4 Drawing Sheets

MEMS DEVICE WITH BI-DIRECTIONAL ELEMENT

CROSS-REFERENCE TO RELATED APPLICATION

This application claims the benefit of U.S. application Ser. No. 11/772,039, filed by Arman Gasparyan, et al., on Jun. 27, 2007, entitled "A MEMS DEVICE WITH BI-DIRECTIONAL ELEMENT," commonly assigned with this application and incorporated herein by reference.

TECHNICAL FIELD OF THE INVENTION

The present invention is directed, in general, to a microelectromechanical device and, more specifically, to a microelectromechanical device, such as a switch or relay, with a bi-directional microelectromechanical element.

BACKGROUND OF THE INVENTION

Microelectromechanical devices, such as switches or relays, may be used as alternatives for conventional electromechanical devices. Advantages to microelectromechanical devices built using conventional semiconductor processes are programmability and reduced size, enabling smaller form factors and a corresponding reduction in power consumption, response time, and cost.

One application that uses conventional microelectromechanical switches and relays is telecom switching gear. In these applications, a microelectromechanical switch or relay may be engaged in one position for a time ranging from weeks to years. It is known that metals under external forces, as found in, for example, components of a microelectromechanical switch and relay, show a permanent deformation when the external force is removed. This phenomenon is known as mechanical creep. If the deformation caused by mechanical creep is great enough, such as found from extended closures of a microelectromechanical switch or relay, the microelectromechanical switch or relay can be rendered unusable over time.

It is not uncommon to find reliability requirements in the telecom industry that demand a lifetime of usage of a device to be 15-20 years. Given this requirement of the telecom industry and mechanical creep inherent in metal microelectromechanical switches and relays, conventional microelectromechanical devices may not meet the need of the telecom industry.

Accordingly, what is needed in the art is microelectromechanical switch or relay that will meet a long term reliability requirement such as found in the telecom industry.

SUMMARY OF THE INVENTION

In one embodiment, the present invention provides a bi-directional microelectromechanical element. In this embodiment, the bi-directional microelectromechanical element comprises a cold beam having a free end and a first end connected to a cold beam anchor. The cold beam anchor is attached to a substrate. A first beam pair is coupled to the cold beam by a free end tether and is configured to elongate when heated thereby to a greater temperature than a temperature of the cold beam. A second beam pair is located on an opposing side of the cold beam from the first beam pair and is coupled to the first beam pair and the cold beam by the free end tether. The second beam pair is configured to elongate when heated thereby to the greater temperature.

In another embodiment, there is provided a microelectromechanical switch. In this embodiment, the microelectromechanical switch comprises a unidirectional microelectromechanical element which includes a first cold beam having a first free end and a first end connected to a first cold beam anchor. The first cold beam anchor is attached to a substrate. A first beam pair is coupled to the first cold beam by a first free end tether and is configured to elongate when heated thereby to a greater temperature than a temperature of the first cold beam. A first tip is attached to the free end of the first cold beam. A bi-directional microelectromechanical element is switchably coupled to the unidirectional microelectromechanical element and includes a second cold beam having a second free end and a first end connected to a second cold beam anchor. The second cold beam anchor is attached to the substrate. A second beam pair is coupled to the second cold beam by a second free end tether and is configured to elongate when heated thereby to a greater temperature than a temperature of the second cold beam. A third beam pair is located on an opposing side of the second cold beam from the second beam pair and is coupled to the second beam pair and the second cold beam by the second free end tether. The third beam pair is configured to elongate when heated thereby to the greater temperature.

In yet another embodiment there is provided a method to reverse mechanical creep of a microelectromechanical device with a bi-directional element. In this particular embodiment, the method comprises moving a bi-directional element in a first direction to a first position and then determining if the bi-directional element has been in the first position for a predetermined amount of time. Based on determining if the bi-directional element has been in the first position for the predetermined amount of time, the method continues by moving the bi-directional element in a second direction opposite the first direction to a second position.

The foregoing has outlined features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
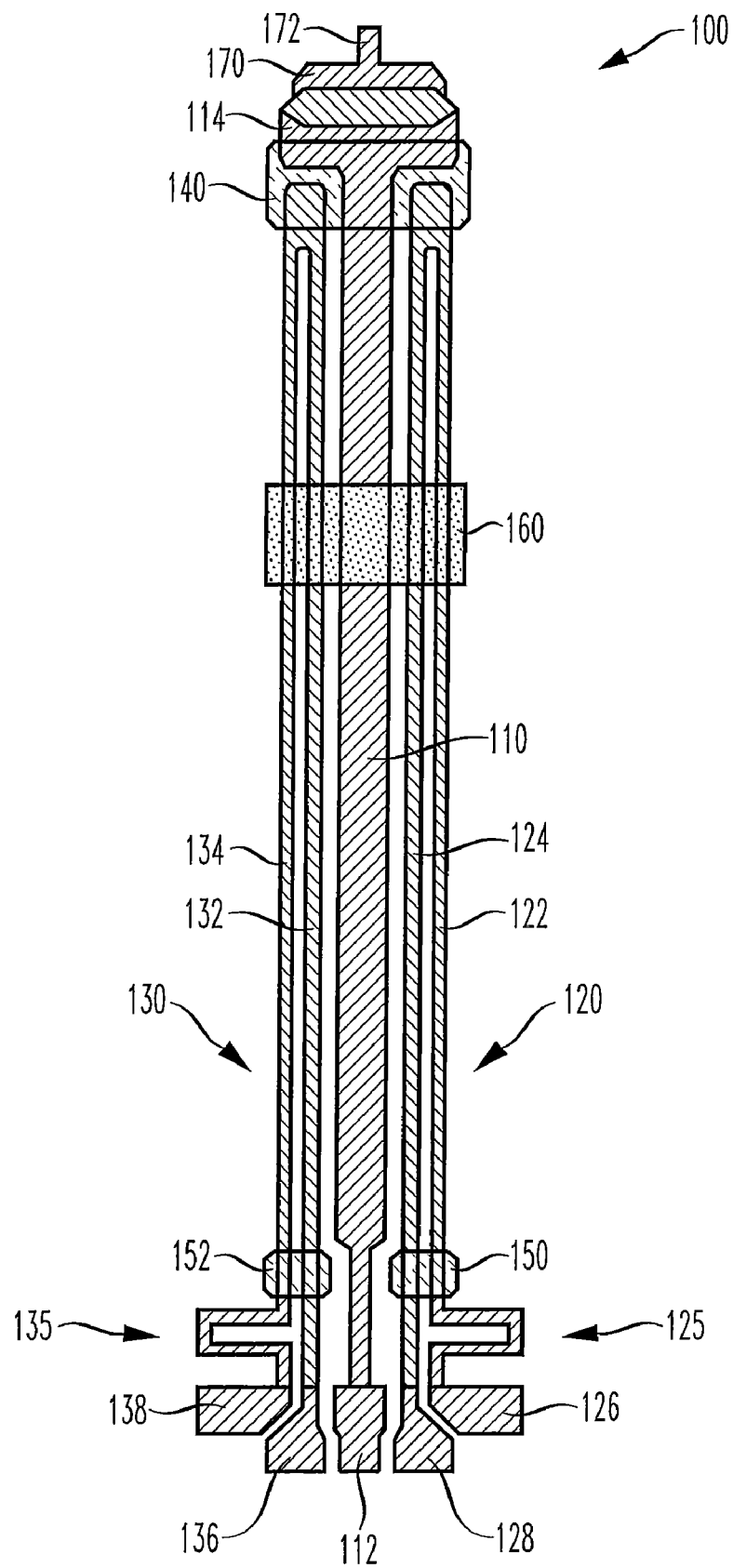
FIG. 1 illustrates a diagram of an embodiment of a bi-directional microelectromechanical element constructed in accordance with the principles of the present invention.

FIG. 1 illustrates a bi-directional microelectromechanical element 100 that contains a cold beam 110, a first beam pair 120, a second beam pair 130, and a free end tether 140. In some embodiments, the cold beam 110 can have a variable width, i.e., a tapered beam or can have two or more sections with different widths. The cold beam 110 has a first end connected to a cold beam anchor 112 and a free end 114. The free end 114 of the cold beam 110 is attached by conventional means to free end tether 140. The cold beam anchor 112 is attached by conventional means to a substrate (not shown). The cold beam 110 is typically made of a metal such as nickel. A portion of the bi-directional microelectromechanical element 100 is located over a trench in the substrate (not shown).

The first beam pair 120 is parallel to the cold beam 110 and is comprised of two parallel members, a first beam member 122 and a second beam member 124, each having a first and second end. The first end of each parallel member is attached to an anchor. The first end of first beam member 122 is attached to a first anchor 126 and the first end of the second beam member 124 is attached to a second anchor 128. First anchor 126 and second anchor 128 are attached to the substrate by conventional means. The second ends of first beam member 122 and second beam member 124 are connected to form a closed loop. The connected second ends of first beam member 122 and second beam member 124 are attached to free end tether 140 by conventional means. Both first beam member 122 and second beam member 124 are typically made of a metal such as nickel.

The second beam pair 130 is parallel to the cold beam 110 and is comprised of two parallel members, a third beam member 132 and a fourth beam member 134, each having a first and second end. The first end of each parallel member is attached to an anchor. The first end of third beam member 132 is attached to a third anchor 136 and the first end of the fourth beam member 134 is attached to a fourth anchor 138. Third anchor 136 and fourth anchor 138 are attached to the substrate by conventional means. The second ends of third beam member 132 and fourth beam member 134 are connected to form a closed loop. The connected second ends of third beam member 132 and fourth beam member 134 are conventionally attached to free end tether 140. Both third beam member 132 and fourth beam member 134 are typically made of a metal such as nickel. In other embodiments, beam pairs may not be parallel to a cold beam or to each other. Additionally, in other embodiments, beam members may have a variable width, i.e., a tapered beam member, may have two or more sections of different widths, or may have a different shape/configuration.

The free end tether 140 mechanically couples: the free end 114 of the cold beam 110; the second ends of first beam member 122 and second beam member 124 of first beam pair 120; and the second ends of third beam member 132 and fourth beam member 134 of second beam pair 130. The free end tether 140 is typically made of (often entirely made of) a dielectric material. In some embodiments, the dielectric is a photoresist material such as "SU-8." SU-8 is a negative, epoxy-type, near-UV photoresist based on EPON SU-8 epoxy resin (from Shell Chemical). It should be noted that other photoresists can be used as well, depending on design requirements. Other possible suitable materials include polyimide, spin on glass, or other polymers. Moreover, combining different materials is also possible. Providing the free end tether 140 over the cold beam 110 and first and second beam pairs 120 and 130, respectively, is advantageous because it allows use of the above-mentioned materials, which in return provide more flexibility on the tether material and a greater reliability.

Both the first beam pair 120 and second beam pair 130 may have a strain relief at the first end of one of the first 122, second 124, third 132, or fourth 134 beam members. In one embodiment as illustrated in FIG. 1, there is a strain relief 125 at the first end of first beam member 122 and a strain relief 135 at the first end of the fourth beam member 134. These strain reliefs decrease the stiffness of the first beam pair 120 and second beam pair 130. Of course, other configurations including a strain relief are possible. In some embodiments, a strain relief may be located or shaped differently or not be used.

Each beam pair 120, 130 can also include at least one beam pair tether deposited anywhere along beam pair 120, 130 between beam member anchors 126, 128, 136, 138 and free end tether 140. FIG. 1 illustrates an embodiment where first beam pair 120 includes a beam pair tether 150 transversally disposed and deposited by conventional means at the first ends of the first beam member 122 and second beam member 124. The embodiment of FIG. 1 also illustrates a beam pair tether 152 transversally disposed and conventionally deposited at the first ends of the third beam member 132 and fourth beam member 134 of the second beam pair 130. The beam pair tethers 150, 152 are dielectric tethers that are typically a photoresist as described above for the free end tether 140.

Additionally, in the embodiment illustrated in FIG. 1, at least one additional tether 160 can be transversally disposed and conventionally deposited across the first beam pair 120, cold beam 110, and second member 130 and located between the free end tether 140 and the cold beam anchor 112. Here, also, the additional tether(s) is typically a photoresist as described above for the free end tether 140 and beam pair tethers 150, 152. Additional tether 160 mechanically couples the first beam pair 120, cold beam 110, and second beam pair 130 so that when deflected, they maintain their relative position to each other.

Attached to the free end 114 of the cold beam is a tip 170. Tip 170 is typically made of a conductive metal such as gold and is attached to the free end 114 of the cold beam 110 with conventional techniques. The tip 170, as illustrated in the embodiment of FIG. 1, has a single prong 172. In other embodiments, there could be more than one prong 172 at the end of the tip 170.

Figure 2:
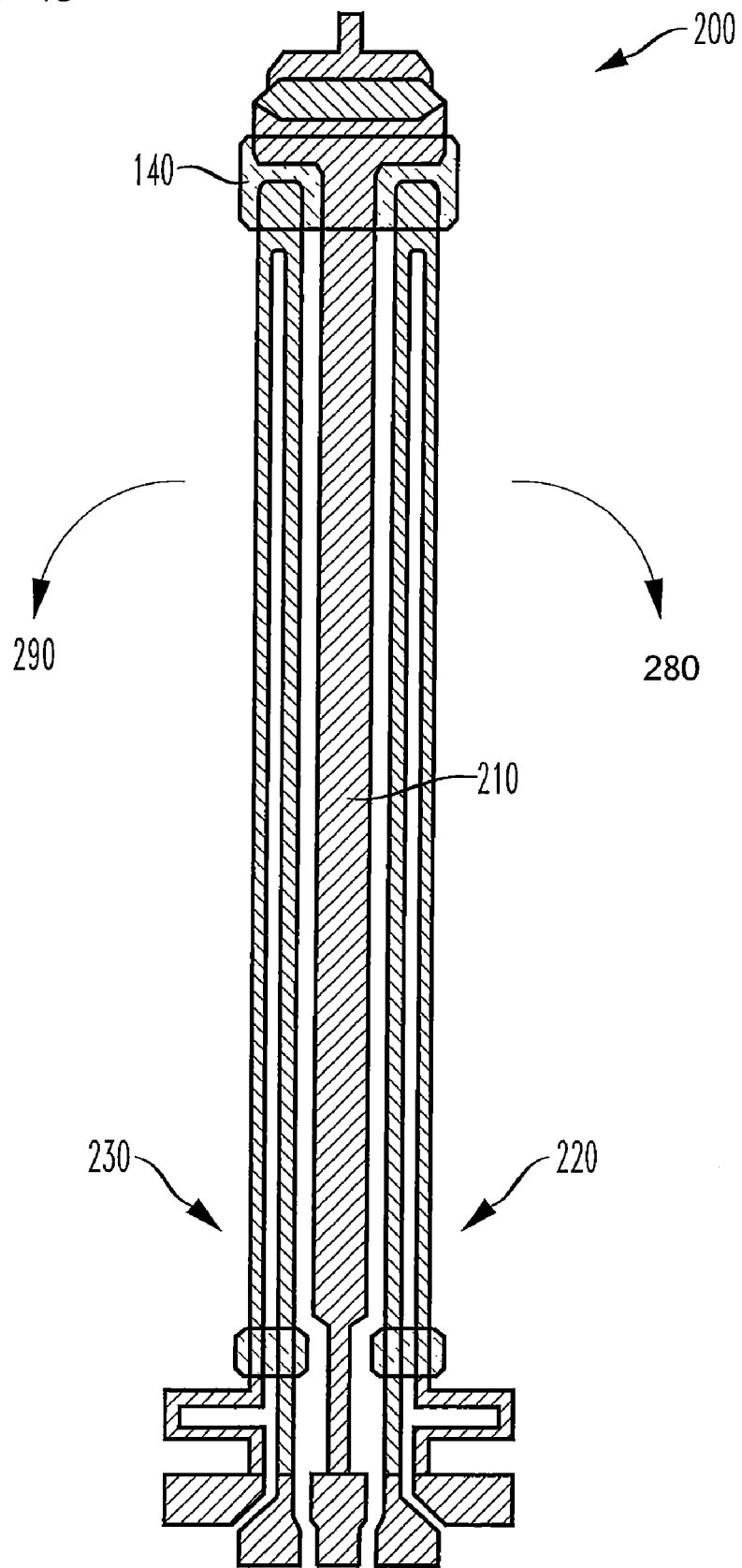
FIG. 2 illustrates a diagram of an embodiment of a bi-directional microelectromechanical element constructed in accordance with the principles of the present invention.

FIG. 2 illustrates an embodiment with a bi-directional microelectromechanical member 200, which is the same as the bi-directional microelectromechanical member 100 of FIG. 1. Bi-directional member 200 includes a cold beam 210, a first beam pair 220, a second beam pair 230, and a free end tether 240 that mechanically couples the cold beam 210, first beam pair 220, and second beam pair 230. The cold beam 210, first beam pair 220, and second beam pair 230 are conventionally attached to a substrate (not shown) via anchors as illustrated in the embodiment of FIG. 1. The first beam pair 220 and the second beam pair 230 are configured to elongate when heated. When either beam pair is heated to a temperature greater than the cold beam 210, the bi-directional member 200, anchored at one end to the substrate, located above a trench in the substrate, and mechanically coupled by free end tether 240, will deflect because the beam pair that is heated will expand greater than the cold beam 210.

In the embodiment shown in FIG. 2, when the first beam pair 220 is heated to a temperature greater than a temperature of the cold beam 210 and second beam pair 230, the bi-directional member 200 will deflect in the direction shown by arrow 290. Conversely, when second beam pair 230 is heated to a greater temperature than the cold beam 210 and first beam pair 220, the bi-directional element 200 will deflect in the direction shown by arrow 280. In the embodiments illustrated in FIGS. 1 and 2, the heating of a beam pair is accomplished by applying current into one beam member of the beam pair and out of the other. For example, current applied in to a first beam member of first beam pair 220 and out of a second beam member will cause the first beam pair 220 to heat and elongate and the bi-directional element 200 will deflect in the direction shown by arrow 290 (because: free end tether 240 mechanically couples cold beam 210, first beam pair 220, and second beam pair 230; cold beam 210, first beam pair 220, and second beam pair 230 are anchored to the substrate; and a portion of bi-directional member 200 is located over a trench in the substrate that allows bi-directional element 200 movement parallel to the substrate). One skilled in the art would understand that bi-directional element 200 may be used an out-of-plane configuration wherein the deflection of the bi-directional element is either towards or away from the substrate.

Figure 3:
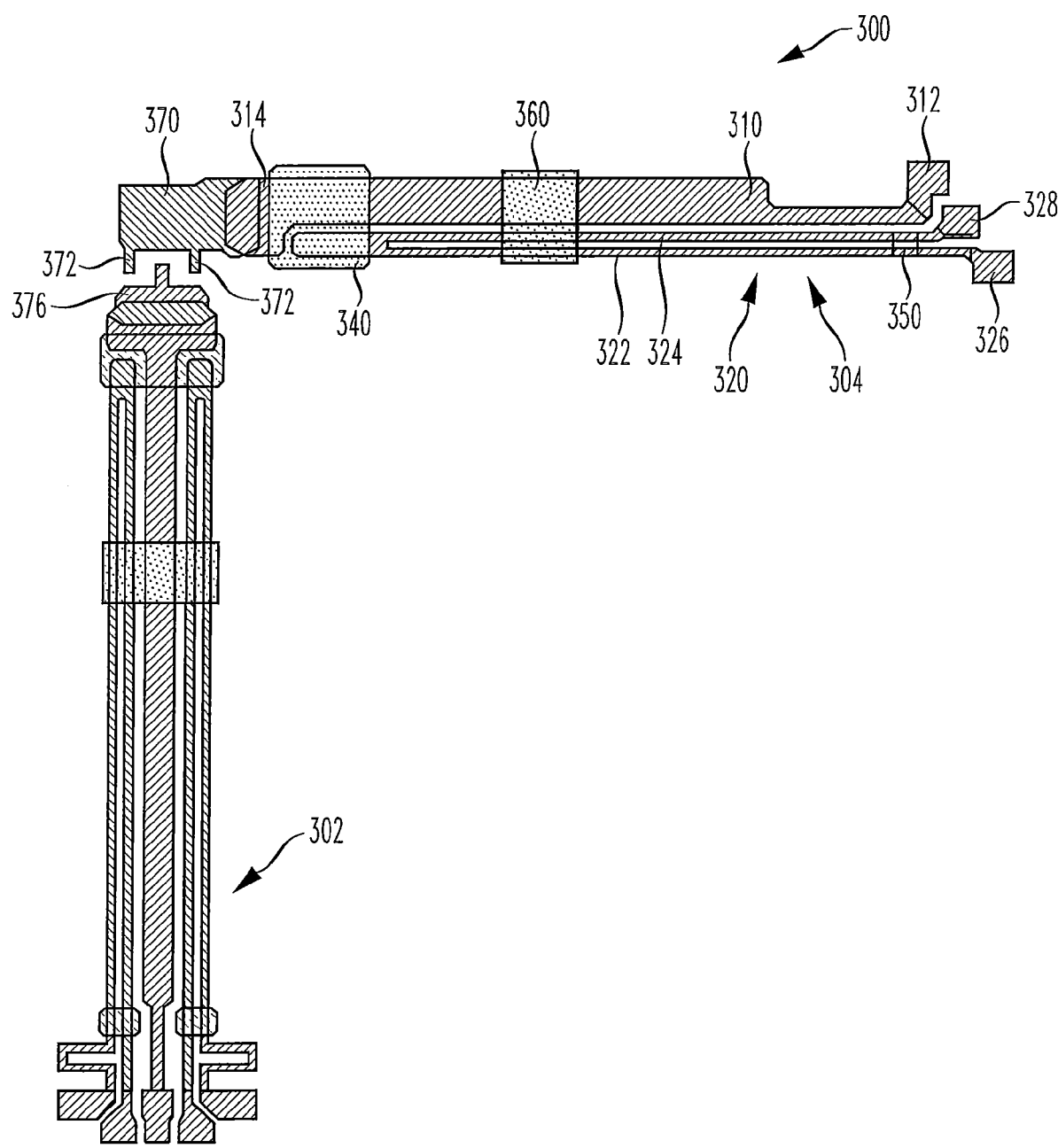
FIG. 3 illustrates a diagram of an embodiment of a microelectromechanical switch constructed in accordance with the principles of the present invention.

FIG. 3 illustrates an embodiment of a microelectromechanical switch 300. The microelectromechanical switch 300 includes bi-directional element 302, which is the bi-directional element 100 of the embodiment illustrated in FIG. 1, and a unidirectional element 304. The microelectromechanical switch 300 can be used to replace conventional microelectromechanical switches as presently employed. In addition to the functionality of conventional microelectromechanical switches, the microelectromechanical switch 300 includes the added functionality of two latch positions. Furthermore, the microelectromechanical switch 300 provides compensation for mechanical creep.

In the illustrated embodiment, unidirectional element 304 includes a cold beam 310 and a beam pair 320. The cold beam 310 has a first end connected to a cold beam anchor 312 and a free end 314. The free end 314 of the cold beam 310 is conventionally attached to a free end tether 340. The cold beam anchor 312 is conventionally attached to a substrate (not shown). The cold beam 310 is typically made of a metal such as nickel. A portion of the unidirectional element 304 is located over a trench in the substrate (not shown).

The beam pair 320 is parallel to the cold beam 310 and is comprised of two parallel members, a first beam member 322 and a second beam member 324, each having a first and second end. The first end of first beam member 322 is conventionally attached to a first anchor 326 and the first end of the second beam member 324 is conventionally attached to a second anchor 328. First anchor 326 and second anchor 328 are attached to the substrate by conventional means. The second ends of first beam member 322 and second beam member 324 are connected to form a closed loop. The connected second ends of first beam member 322 and second beam member 324 are attached by conventional means to free end tether 340. Both first beam member 322 and second beam member 324 are typically made of a metal such as nickel.

The free end tether 340 mechanically couples the free end 314 of the cold beam 310 and the second ends of first beam member 322 and second beam member 324. As with the free end tether 140 of the embodiment illustrated in FIG. 1, the free end tether 340 is typically made up of a photoresist such as SU-8.

The beam pair 320 may have a strain relief at the first end of one of the first beam member 322 or second beam member 324 (not shown). As with the strain reliefs 135 of the embodiment as illustrated in FIG. 1, the strain relief (not shown) decreases the stiffness of the beam pair 320. Beam pair 320 may include at least one beam pair tether 350, transversally disposed and deposited by conventional means anywhere along beam pair 320 between beam member anchors 326,328 and free end tether 340. The beam pair tether 350 is typically a photoresist as described above for the dielectric tether 340.

Additionally, in the embodiment illustrated in FIG. 3, at least one additional tether 360 can be transversally disposed and conventionally deposited across beam pair 320 and cold beam 310 between the free end 314 of cold beam 310 and the cold beam anchor 312. Here, also, the additional tether(s) 360 is typically a photoresist as described above for the free end tether 340.

Attached to the free end 314 of the cold beam 310 is a first tip 370. First tip 370 is typically made of a conductive metal such as gold and is attached to the free end 314 of the cold beam 310 with conventional techniques. The first tip 370 has two prongs 372. In other embodiments, there could be a single prong 372 or multiple prongs 372 at the end of the first tip element 370. The first tip element 370 is switchably couplable with a second tip element 376 of the bi-directional microelectromechanical element 302.

Similar to the embodiment as described in FIG. 2, the beam pair 320 of the unidirectional element 304 is configured to elongate when heated. When the beam pair 320 is heated to a temperature greater than the cold beam 310, the unidirectional member 304, anchored at one end to the substrate, located above a trench in the substrate, and mechanically coupled by dielectric tether 340, will deflect because the heated beam pair 320 will expand greater than the cold beam 310. When the beam pair 320 is heated to a greater temperature than the cold beam 310 the unidirectional micromechanical member 304 will deflect away from the bi-directional element 302. The heating of beam pair 320 is accomplished by applying current into the first beam member 322 of first beam pair 320 and out of second beam member 324, causing beam pair 320 to heat and elongate.

In some embodiments, the bi-directional element 302 can be implemented in an out-of-plane configuration. In these embodiments, the bi-directional element 302 moves in a direction not parallel to the substrate but either towards or away from the substrate. For these embodiments, the bi-directional element 302 would not be switchably couplable to unidirectional element 304 but, rather, switched to contacts which can be in a different plane or planes. For example, the contacts may be in the substrate or in a layer or layers above the substrate. Also, in these embodiments, the mechanism to move a cold beam could, in addition to expansion from an adjacent, mechanically coupled heated beam pair, be another mechanism, such as an electrostatic or a capacitive mechanism. A bi-directional element constructed according to the present invention may be employed in an RF microelectromechanical switch as disclosed in an article in the December, 2001 IEEE Microwave Magazine entitled "RF MEMS Switches and Switch Circuits" by Gabriel M. Rebeiz, et al., which is incorporated herein by reference in its entirety.

Figure 4:
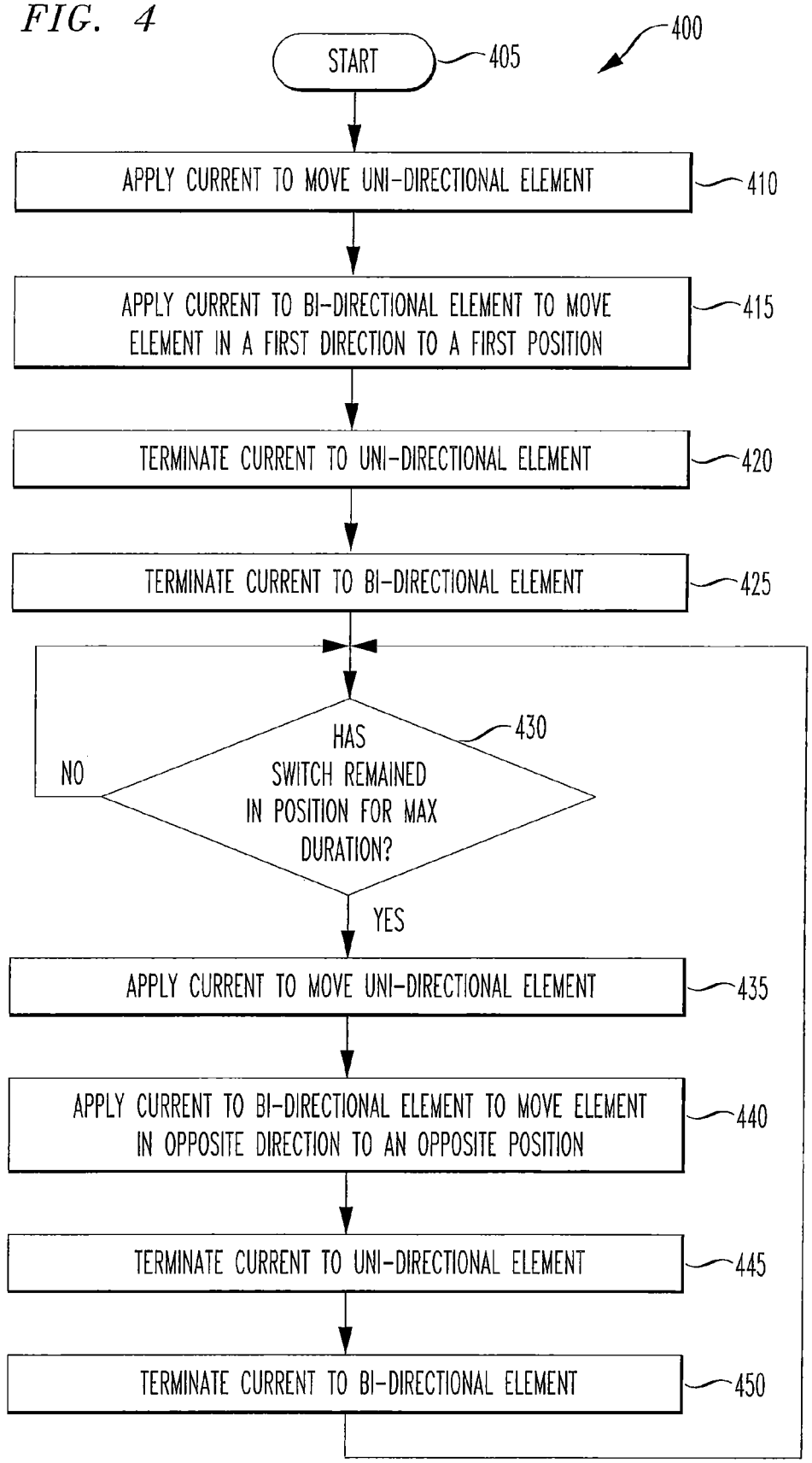
FIG. 4 illustrates a flow diagram of one embodiment of a method to reverse mechanical creep of a microelectromechanical device with a bi-directional element employing the techniques of the present invention.

FIG. 4 illustrates an embodiment of a method to reduce creep in a microelectromechanical device with a bi-directional element 400, carried out in accordance with the principles of the present invention. The method 400 begins in a step 405 with an intent to reduce creep in a microelectromechanical device with a bi-directional element.

After beginning, a current is applied to a unidirectional element of the microelectromechanical device to move the unidirectional element away from its initial position in step 410. The current may be applied to a beam pair of the unidirectional element to move a cold beam of the unidirectional element from the initial position and away from the bi-directional element of the microelectromechanical device. After the current is applied to the unidirectional element to move it away from its initial position, current is then applied to the bi-directional element of the microelectromechanical device to move it in a first direction away from its initial position to a first position in step 415. The current may be applied to a beam pair of the bi-directional element to move a cold beam of the bi-directional element from the initial position. The current to the unidirectional element is then terminated in step 420 allowing the unidirectional element to return to its initial position. This may be accomplished by removing the current from the beam pair of the unidirectional element. Once the current has been terminated to the unidirectional element to move it back to its initial position, the current to the bi-directional element in the microelectromechanical device is terminated in step 425. This may be accomplished by removing the current from the beam pair of the bi-directional element.

After the current is terminated to the bi-directional element in step 425, the bi-directional element attempts to move back to its initial position. However, a prong of a tip of the unidirectional element prevents the bi-directional element from returning to its initial position by contacting a prong of a tip of the bi-directional element. The prong of the bi-directional element, which was displaced when the current was applied, contacts the prong of the unidirectional element which prevents the bi-directional element from returning to is initial position. In this position, the bi-directional element is deformed and an electrical contact is formed between the unidirectional element and the bi-directional element. The prong, tip, and cold beam of the unidirectional element are electrically conductive and in contact with the horizontally displaced and electrically conductive prong, tip, and cold beam of the bi-directional element. In this position, a conductive path is formed that can carry an electrical signal through the microelectromechanical device.

In many applications, such as telecom applications, a microelectromechanical device such as a switch or relay may need to remain in a closed position for an extended period of time, on the order of weeks to months. It is known that metals under external forces for a sufficient time show a permanent deformation when the external force is removed resulting in mechanical creep. In a typical microelectromechanical device such as a switch or relay, the total distance a switch element must move to operate can be on the order of several microns. If the microelectromechanical device is held in one position for a sufficient period of time, misplacement of the switch element due to mechanical creep may be on the order of 3-4 microns and be great enough to render the microelectromechanical device inoperable. As such, a predetermined time is established based on a maximum time to hold the bi-directional member in one position before rendering the microelectromechanical device inoperable. Thus, the method 400 proceeds to step 430 and determines if the microelectromechanical switch has remained in a position for the predetermined time. The predetermined time a bi-directional member of a microelectromechanical switch can be held in one position before deforming a sufficient amount that renders the microelectromechanical switch inoperable is based on historical data and many factors, such as, for example: the design of the microelectromechanical switch, e.g., the total distance the switch element must move, the material the bi-directional element and unidirectional element are comprised of, the dimensions of components of the bi-directional and unidirectional elements, etc.; and the ambient temperature of the microelectromechanical device. One of ordinary skill in the art would understand there are other parameters that could aid in the determination of the maximum time to hold the bi-directional element in one position. A controller associated with the microelectromechanical switch may store or access the above-mentioned parameters associated with the microelectromechanical switch and decide when the predetermined time has occurred. The controller may be a conventional device electrically coupled to the unidirectional and bi-directional elements of the microelectromechanical switch.

If, in the decisional step 430, the switch has remained in one position for the predetermined time, the method moves on to step 435 where current is applied to the unidirectional element to move it away from its initial position and the bi-directional element. In some embodiments, a current can be applied to the bi-directional element to help break contact with the unidirectional element before moving to step 435. If the switch has not remained in one position for the predetermined time, the method 400 returns to step 430. Once the current to the unidirectional element is applied to move it away from its initial position, current is applied in step 440 to move the bi-directional element in an opposite direction and to move a second prong of the tip element horizontally displaced opposite the first prong of the tip element beyond the prong of the unidirectional element. Once the current is applied to the bi-directional element, the current to the unidirectional element is terminated in step 445 allowing the unidirectional element to return to its initial position.

After the current is terminated to the unidirectional element in step 445, the current is then terminated to the bi-directional element in step 450. As in step 425, the bi-directional element attempts to move back to its initial position. Again, the prong of the tip of the unidirectional element prevents the bi-directional element from returning to its initial position as the second prong of the tip element of the bi-directional element horizontally displaced opposite the first prong of the tip element of the bi-directional element contacts the prong of the tip element of the unidirectional element, stopping the movement of the bi-directional element. In this position, the bi-directional element is deformed in an opposite direction and will reverse the mechanical creep induced in the bi-directional member when in the previous position if held in place for a sufficient time. As before, the cold beam, tip, and prong of the bi-directional element and the cold beam, tip, and prong of the unidirectional element are electrically coupled and form a circuit which passes an electrical signal through the microelectromechanical device.

After moving the bi-directional element into an opposite position, the method 400 returns to step 430 and continues as before. Other configurations of the prongs of the tips of the unidirectional and bi-directional elements to accomplish the same reversal of mechanical creep induced from long-term deformations of the elements are within the scope of the invention but are not described here.

Although the present invention has been described in detail, those skilled in the art should understand that they can make various changes, substitutions and alterations herein without departing from the spirit and scope of the invention in its broadest form.

What is claimed is:

1. A method to reduce mechanical creep in a microelectromechanical device with a bi-directional element comprising:
   moving said bi-directional element in a first direction to a first position, wherein said bi-directional element includes a cold beam, a first beam pair, and a second beam pair;
   determining if said bi-directional element has been in said first position a predetermined amount of time; and based on said determining, moving said bi-directional element in a second direction opposite said first direction to a second position.

2. The method as recited in claim 1 further comprising:

moving a unidirectional element of said microelectromechanical device from an initial position before moving said bi-directional element in said first direction; and moving said unidirectional element of said microelectromechanical device to said initial position after moving said bi-directional element to said first position.

3. The method as recited in claim 1 wherein said moving said bi-directional element to said first position comprises applying a current to a first beam pair.

4. The method as recited in claim 1 wherein said moving said bi-directional element to said second position comprises applying a current to a second beam pair.

5. The method as recited in claim 1 wherein said determining is based on parameters selected from a group consisting of:

historical data,
composition of said bi-directional element,
design of said bi-directional element, and
ambient temperature of said microelectromechanical device.

6. The method as recited in claim 1 wherein said determining is performed by a controller associated with said microelectromechanical device.

* * * * *